(12) United States Patent
Wood

(10) Patent No.: US 7,342,461 B1
(45) Date of Patent: Mar. 11, 2008

(54) FEEDBACK CIRCUIT FOR MINIMIZING VCO SENSITIVITY

(75) Inventor: John Wood, Santa Cruz, CA (US)

(73) Assignee: Multigig, Inc., Scotts Valley, CA (US)

( * ) Notice: Subject to any disclaimer, the term of this patent is extended or adjusted under 35 U.S.C. 154(b) by 0 days.

(21) Appl. No.: 11/361,290

(22) Filed: Feb. 23, 2006

Related U.S. Application Data

(60) Provisional application No. 60/656,619, filed on Feb. 24, 2005.

(51) Int. Cl.
*H03L 7/00* (2006.01)

(52) U.S. Cl. .................. 331/16; 331/1 R; 331/34; 331/74; 331/175; 455/260

(58) Field of Classification Search ............. 331/1 R, 331/16, 175, 34, 74, 185; 455/260
See application file for complete search history.

(56) References Cited

U.S. PATENT DOCUMENTS

| | | | |
|---|---|---|---|
| 5,493,714 A | 2/1996 | Humphreys et al. | |
| 6,259,327 B1 | 7/2001 | Balistreri et al. | |
| 6,556,089 B2 * | 4/2003 | Wood | 331/57 |
| 7,185,239 B2 * | 2/2007 | Tiwari | 714/700 |

\* cited by examiner

*Primary Examiner*—Arnold Kinkead
(74) *Attorney, Agent, or Firm*—Anthony B. Diepenbrock, III; Dechert LLP

(57) ABSTRACT

System and method for adjusting supply voltage to VCO to minimize affects of circuit noise on VCO. Method includes obtaining a number of data points each by incrementing a counter by the number of VCO periods during a phase of a local oscillator, changing the supply voltage, decrementing the counter by the number of VCO periods during another phase of the local oscillator, and then storing the net count. Then among the saved data points a data point is selected that is the point at or near where the VCO is least sensitive to supply changes and the VCO is set to operate at the supply voltage corresponding to this data point. A system includes a controller, up/down counter, local oscillator, and VCO. The counter counts the oscillations of the VCO and a stored net counts provide information as to where the VCO is least sensitive to the supply voltage.

9 Claims, 3 Drawing Sheets

FEEDBACK CIRCUIT FOR MINIMIZING VCO SENSITIVITY

CROSS-REFERENCE TO RELATED APPLICATIONS

This application claims priority to U.S. Provisional Application 60/656,619, titled "FEEDBACK CIRCUIT FOR MINIMIZING VCO SENSITIVITY," filed on Feb. 24, 2005, which application is incorporated by reference into the present application.

FIELD OF THE INVENTION

The present invention relates to minimizing the sensitivity of an oscillator to external influences, and more particularly the sensitivity of an oscillator to supply voltage changes.

DESCRIPTION OF THE RELATED ART

Oscillators are used in a wide variety of systems and their phase noise characteristics determine the performance of many of these systems. Phase noise for an oscillator is usually described by means of a spectrum about the nominal frequency of the oscillator. Noise power that is very close to the oscillator frequency falls very quickly (as $1/f^3$). Noise power moderately close to the oscillator frequency falls less quickly (as $1/f^2$). Noise power that is some spectral distance from the oscillator frequency eventually reaches a noise floor, which stays nearly constant. The $1/f^3$ noise is particularly important to control, as this component has a significant effect on narrow channel communication systems. Significantly, 1/f circuit noise (baseband noise) is the source of most of the $1/f^3$ as this 1/f noise is up-converted (mixed) to become $1/f^3$ noise near the oscillator frequency. Circuit noise typically comes from the semiconductor components used to restore energy dissipated by the lossy oscillation components. While thermal noise can be a source of circuit noise, the most important contribution to circuit noise comes from substrate and the power supply used to build and power the semiconductor circuitry. If components which sustain the oscillator energy are CMOS components, the 1/f circuit noise is significant and its up-conversion creates a noise problem for the oscillator. It is desirable to minimize the supply-induced circuit noise to cut down on the up-converted phase noise. FIG. 1 shows a prior art oscillator using symmetry to suppress up-converted phase noise. The oscillator is an LC tank circuit with L1, C1, L2, C2 setting the frequency. The oscillator uses resistors R1 R2 which are substantially free of 1/f noise, instead of a transistor current source, to define the tail current. To avoid lowering the Q of the circuit, inductors L3 and L4 are added to raise the tail impedance at the oscillation frequency and its harmonics. Also, to compensate for the flicker noise inherent in the offset voltage $V_{1/f}$ that unbalances the differential pair, a balancing capacitor $C_c$ is added to decouple the sources of M1 and M2. While symmetrical circuitry can help to reduce phase noise, it is helpful to employ additional techniques to obtain the lowest close-in noise possible.

BRIEF SUMMARY OF THE INVENTION

Rotary VCOs and some other LC VCOs can exhibit complete elimination of up-converted flicker when designed with special features (e.g. offset gates, bias filtering respectively). It is expected that these optimal operating points (or points almost optimal) are achievable over PVT (Process Voltage Temperature), but in some processes and for the maximum benefit and yield, a system is described herein that lets each device optimize itself to find the 'sweet spot,' no matter what changes occur to process and/or temperature and/or voltage. This system also automatically sets the point of minimum supply voltage sensitivity and makes the oscillator more supply-noise immune, thus improving the system as a block on an IC and minimizing the need for external decoupling capacitance for supply filtering.

The concept here is to add to the VCO a measuring device and control circuits that let complete subsystem adjust itself to select an operating point that yields the best phase noise performance and/or supply insensitivity. This is somewhat like a self-calibration technique. The technique is also applicable to conventional LC sine wave VCOs, but rotary oscillators are preferred.

VCOs can be designed to have, to first order, low power-supply sensitivity by the usual methods of balancing components that have +dF/dV effects with components that have −dF/dV effects. These effects can be selected by choice of the time-period setting components of a VCO (usually capacitors, inductors, transistors, resistors, diodes).

Up-converted phase noise is different from a simple FM modulation effect. It arises when non-linearity of devices convert low-frequency noise into noise close to the carrier in a mechanism similar to that inside an RF mixer.

It has been experimentally observed that an operating condition (a particular VDD supply voltage for example) for a specially designed Rotary VCO exists (such as that described in U.S. Pat. No. 6,556,089, which patent is incorporated by reference into the present application) at which the elimination of up-converted flicker noise can be easily, but indirectly detected, by determining when the dF/dVDD slope becomes a minimum, i.e., a point where small changes in VDD do not have much effect on the operating frequency. It is not yet known at this time exactly why this applies, but it seems a reliable indicator and applies especially to Rotary clocks using the offset-gate layout technique.

If the rotary VCO is operated at this point of relatively flat dF/dVDD, then it is extremely insensitive to power supply noise, provided that the magnitude of the noise does not push the oscillator outside of the 'flat' range of dF/dVDD.

It should be noted that not every VCO design that exhibits a region of zero dF/dVDD also exhibits minimization of flicker noise up-conversion, but those oscillators that are designed to be flicker-noise suppressed can be designed to have this coincide with the zero in the dF/dVDD point and it has been observed that this tell-tail sign is a reliable, indirect indicator that the up-converted flicker noise (and possibly white noise) is being suppressed.

One embodiment of the present invention is a system for tuning an application oscillator for minimum sensitivity to supply voltage changes. The system includes an application oscillator, a controllable voltage source, a local oscillator, a counter, and a controller. The application oscillator is operative to generate an oscillation whose frequency is a function of a control voltage, where the generated frequency has a sensitivity to a supply voltage. The controllable voltage source is operative to generate a supply voltage for use by the application oscillator in response to digital control signals. The local oscillator is operative to generate an oscillation whose frequency is substantially lower than the application oscillator frequency when an enable signal is active. The counter is operative to count in a first or second direction, on the occurrence of an oscillation from the application oscillator, according to an up/down control signal when enabled by a phase of the local oscillator. The controller is operative to generate the digital control signals to vary the voltage supply of the application oscillator, the enable signal for the local oscillator to start and stop the local oscillator, and the up/down signal to control the counting direction of the up/down counter. The controller is further operative to cause the counter to count in the first direction a number of oscillations of the application oscillator occurring during a phase of the local oscillator, to count in the second direction a number of oscillations of the application oscillator occurring during another phase of the local oscillator and to save the up/down digital count after counting in the first and second direction, where the saved value being indicative of the frequency sensitivity of the application oscillator.

Another embodiment is a method for tuning an application oscillator for minimum sensitivity to supply voltage changes. The method includes, (i) for a specified number of data points, performing the steps of initializing a counter, incrementing the counter by a number of application oscillator periods occurring during a phase of a local oscillator, decreasing the supply voltage of the application oscillator by a prescribed amount, decrementing the counter by a number of application oscillator periods occurring during another phase of a local oscillator, and saving the net count of the counter as a data point, (ii) selecting among the saved data points a data point at or near where the application oscillator is least sensitive to changes in the supply voltage, and (iii) setting the application oscillator supply voltage to the voltage corresponding to the selected data point.

One advantage of the present invention is that the invention automatically sets the point of minimum supply voltage sensitivity and makes the oscillator more supply-noise immune, thus improving the system as a block on an IC and minimizing the need for external decoupling capacitance for supply filtering.

Another advantage is that the invention lets each device optimize itself to find the 'sweet spot,' no matter what changes occur to process and/or temperature and/or voltage.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
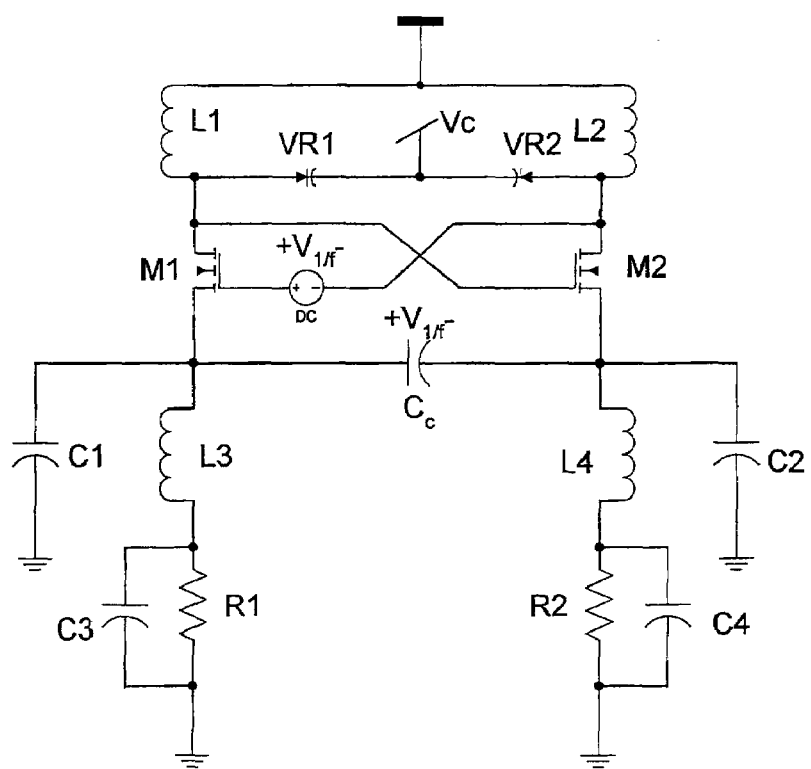
FIG. 1 shows a prior art oscillator using symmetry to suppress up-converted phase noise.
Figure 2:
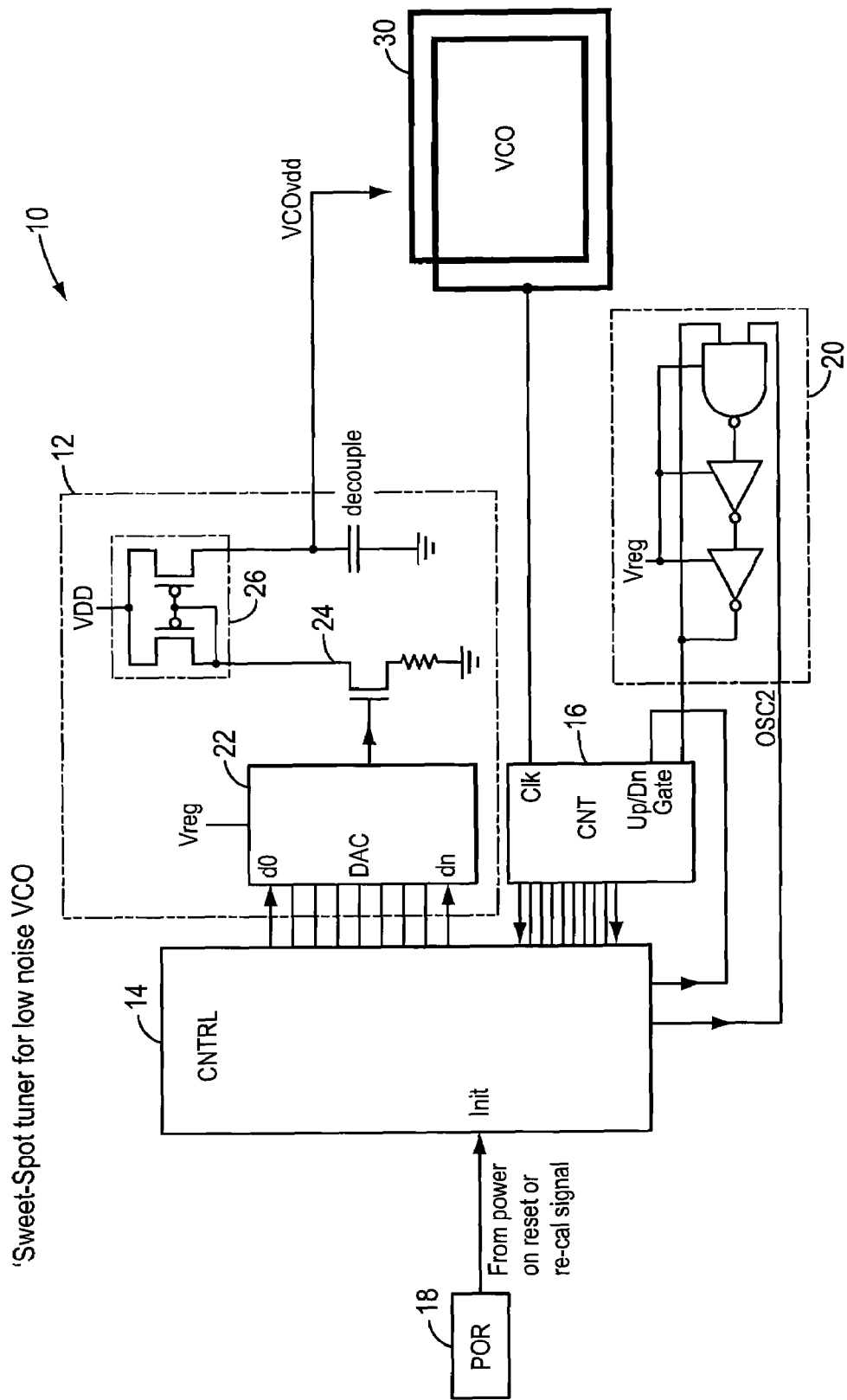
FIG. 2 shows an embodiment of the present invention.

As shown in FIG. 2, the preferred embodiment 10 includes a programmable voltage/current generator 12 with digital control (DAC) 22, a digital controller 14 such as a microcontroller or state machine, counter circuitry 16, a power-on reset circuit 18, and an independent, moderately stable local oscillator 20.

The digital controller 14 drives the digital inputs of the DAC 22, which is connected to a source follower 24 (to buffer the output of the DAC) and a mirror 26 in the programmable voltage/current generator 12 that provides the requisite current and voltage to an application oscillator, such as VCO 30, whose supply is to be adjusted for lowest phase noise. The digital controller 14 receives the outputs of the counter circuitry 16, preferably an up/down counter, and controls the up/down signal of the counter and an enable on the local oscillator. The output of the local oscillator 20 drives the gate of the counter circuitry 16, which permits the counter circuitry 16 to count the pulses from the VCO 30 (shown as a rotary traveling wave oscillator).

Figure 3:
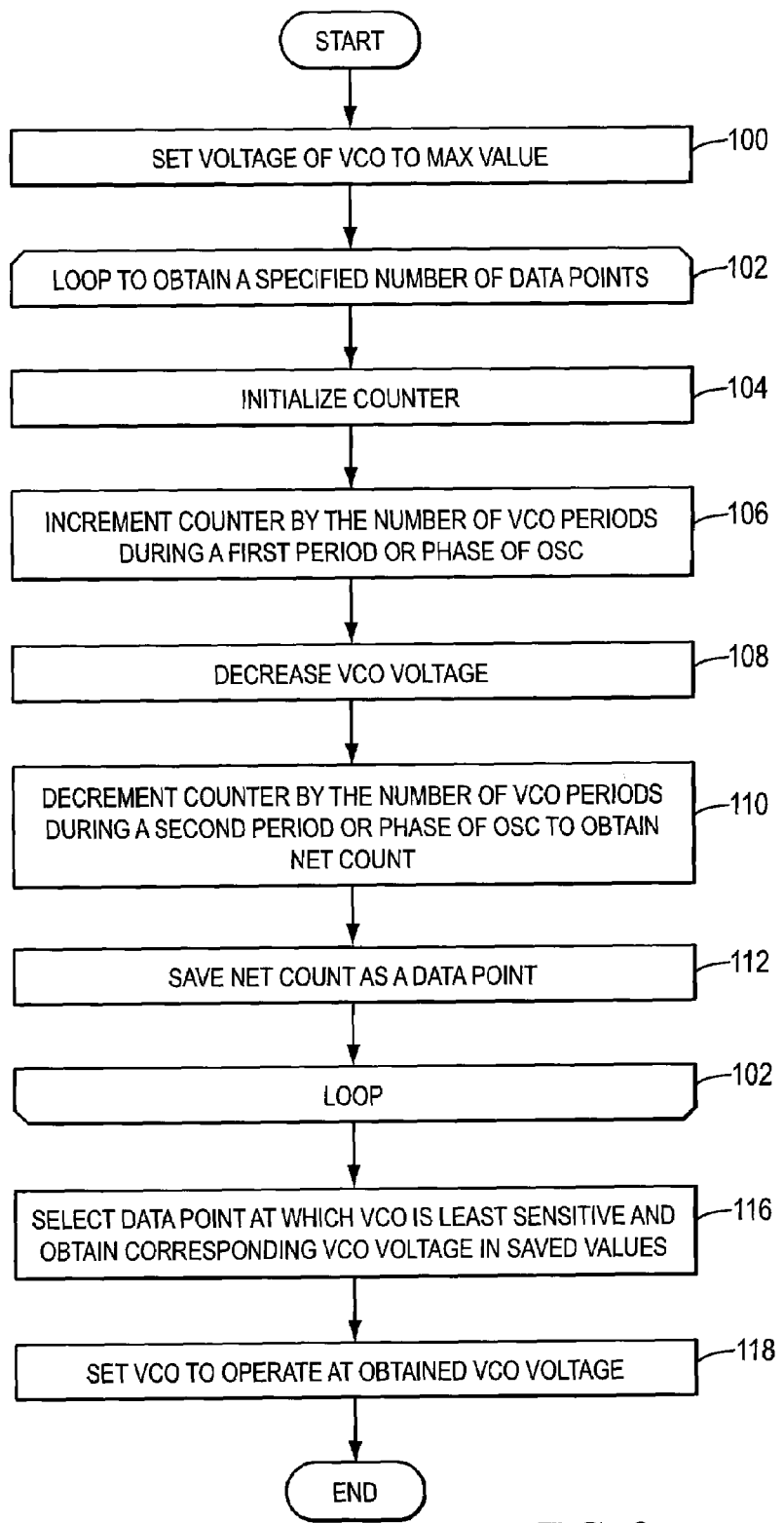
FIG. 3 shows a flow chart of a method in accordance with an embodiment of the present invention.

Referring to the flow chart of FIG. 3, on power up, the digital controller 14 initially sets, in step 110, the bias current to the application oscillator 20 via the DAC so that the VDDvco (the VCO supply voltage) is at its maximum value. It is known from simulation and previous tests of the oscillator core that the optimum operating point lies below this voltage.

The count value in the counter circuitry CNT 16 is initialized, in step 104, i.e., reset, via the init input, to 0 by the digital controller 14.

Next, in step 106, the controller 14 uses a first period or phase from local oscillator OSC2 20 to enable the counter circuitry 16 to count transitions from the application oscillator VCO 30 (because Up/Down control is set to Up). The local oscillator OSC2 20 and the counter value in the counter circuitry CNT 16 work together as a frequency measurement device to record the approximate operating frequency of VCO 30. The local oscillator OSC2 20 need not be ultra-high precision, just stable enough in the short-term, as will be seen below, and have a time period long enough to capture possibly 1000s of the VCO 30 pulses.

Next, in step 108, the digital controller 14 decreases the VCO 30 voltage by changing the setting of the current control DAC 22 to the next lower value. This causes a small drop in voltage on the VCOvdd node.

Now, in step 110, the Up/Down pin is changed by the controller 14 to make the counter circuitry 16 count down and another cycle or phase of the local oscillator OSC2 20 enables the counter circuitry 16 to count the VCO 30 pulses. This is effectively produces a frequency comparison between the current VCO frequency and the VCO frequency at the previous setting of the DAC 22. The number in the counter circuitry 16 represents the change in VCO 30 frequency caused by the drop in the DAC 22 setting, i.e., the drop in VDDvco (assuming local oscillator OSC2 30 frequency hasn't changed very much). The local oscillator OSC2 20 frequency has to be stable between the up and the down measurements. The controller 14 stores, in step 112, the net count in the counter circuitry 16 (the frequency comparison) in a memory for later use and the above cycle is repeated several times, according to the loop 102 shown, to obtain multiple counter value data points.

Eventually, the 'sweet-spot' is found beyond which the VCO 30 exhibits a higher slope on dF/dVDD curve. The recorded results from all the steppings of the DAC 22 are used by the controller to select, in step 116, the best 'Sweet Spot' setting of the DAC 22, possibly choosing 'best place' using a complex algorithm. The VCO voltage on the VCOvdd node is set, in step 118, to the corresponding value.

This sequence of events is easy to combine with the VCO coarse-tuning step present in many VCOs.

The description above assumes a one-off self-adjustment on power-up, but there are situations where it is beneficial to do this during normal operation to account for temperature, supply voltage drift.

Although the present invention has been described in considerable detail with reference to certain preferred versions thereof, other versions are possible. For example, the oscillator need not be a voltage-controlled oscillator; any oscillator that needs to have reduced phase noise can benefit from the invention described herein. Therefore, the spirit and scope of the appended claims should not be limited to the description of the preferred versions contained herein.

What is claimed is:

1. A method for tuning an application oscillator for minimum sensitivity to supply voltage changes, the method comprising:
   for a specified number of data points, performing the steps of
     initializing a counter,
     incrementing the counter by a number of application oscillator periods occurring during a phase of a local oscillator,
     decreasing the supply voltage of the application oscillator by a prescribed amount,
     decrementing the counter by a number of application oscillator periods occurring during another phase of a local oscillator, and
     saving the net count of the counter as a data point;
   selecting among the saved data points a data point at or near where the application oscillator is least sensitive to changes in the supply voltage; and
   setting the application oscillator supply voltage to the voltage corresponding to the selected data point.

2. A method for tuning an application oscillator as recited in claim 1, wherein selecting a data point at which the application oscillator is least sensitive includes finding a data point with the smallest net count.

3. A system for tuning an application oscillator for minimum sensitivity to supply voltage changes, the system comprising:
   an application oscillator operative to generate an oscillation for use by an application, the oscillation having a frequency having a sensitivity to a supply voltage;
   a controllable voltage source operative to generate a supply voltage for use by the application oscillator in response to digital control signals;
   a local oscillator operative to generate an oscillation whose frequency is substantially lower than the application oscillator frequency when an enable signal is active;
   an up/down counter that is operative to count in a first or second direction, on the occurrence of an oscillation from the application oscillator, according to an up/down control signal when enabled by a phase of the local oscillator; and
   a controller that generates the digital control signals to vary the voltage supply of the application oscillator, the enable signal for the local oscillator to start and stop the local oscillator, and the up/down signal to control the counting direction of the up/down counter, wherein the controller is operative to cause the counter to count in the first direction a number of oscillations of the application oscillator occurring during a phase of the local oscillator, to count in the second direction a number of oscillations of the application oscillator occurring during another phase of the local oscillator, and wherein the controller is operative to save the up/down digital count after counting in the first and second direction, the saved value being indicative of the frequency sensitivity of the application oscillator.

4. A system for tuning an application oscillator as recited in claim 3, wherein counting in the first direction increments the counter and counting in the second direction decrements the counter.

5. A system for tuning an application oscillator as recited in claim 3, wherein counting in the first direction decrements the counter and counting in the second direction increments the counter.

6. A system for tuning an application oscillator as recited in claim 3, wherein the local oscillator has a frequency that is about one thousandth of the frequency of the application oscillator.

7. A system for tuning an application oscillator as recited in claim 3, wherein the controllable voltage source includes:
   a digital to analog converter (DAC) operative to receive the digital control signals from the controller and provide an analog voltage proportional to a value represented by the digital control signals;
   a source follower circuit that buffers the analog voltage from the DAC; and
   a mirror circuit that provides the control voltage to the application oscillator in response to the buffered analog voltage.

8. A system for tuning an application oscillator as recited in claim 3, wherein the local oscillator is a ring oscillator.

9. A system for tuning an application oscillator as recited in claim 3, wherein the application oscillator is a rotary oscillator.

* * * * *